US012136456B2

(12) United States Patent
Sforzin et al.

(10) Patent No.: US 12,136,456 B2
(45) Date of Patent: Nov. 5, 2024

(54) DRIFT COMPENSATION FOR CODEWORDS IN MEMORY

(71) Applicant: Micron Technology, Inc., Boise, ID (US)

(72) Inventors: Marco Sforzin, Cernusco sul Naviglio (IT); Paolo Amato, Treviglio (IT); Luca Barletta, Gallarate (IT); Marco Pietro Ferrari, Milan (IT); Antonino Favano, Brolo (IT)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 17/948,582

(22) Filed: Sep. 20, 2022

(65) Prior Publication Data
US 2024/0071487 A1 Feb. 29, 2024

Related U.S. Application Data

(60) Provisional application No. 63/402,338, filed on Aug. 30, 2022.

(51) Int. Cl.
G11C 29/00 (2006.01)
G11C 11/4074 (2006.01)
(Continued)

(52) U.S. Cl.
CPC ...... G11C 11/5642 (2013.01); G11C 11/4074 (2013.01); G11C 11/4099 (2013.01)

(58) Field of Classification Search
CPC ........... G11C 11/5642; G11C 11/4074; G11C 11/4099; G11C 29/021; G11C 16/26; G11C 29/028
See application file for complete search history.

(56) References Cited

U.S. PATENT DOCUMENTS 5,608,397 A * 3/1997 Soljanin ............... H03M 5/145
341/95
9,563,502 B1 * 2/2017 Alhussien ........... G11C 11/5642
(Continued)

FOREIGN PATENT DOCUMENTS

WO 2022/101655 A1 5/2022

OTHER PUBLICATIONS

Schouhamer Immink, et al., "Minimum Pearson Distance Detection for Multilevel Channels With Gain and/or Offset Mismatch", IEEE Transactions on Information Theory, issue 10, vol. 60, Oct. 2014, pp. 5966-5974.

(Continued)

Primary Examiner — Khamdan N. Alrobaie
(74) Attorney, Agent, or Firm — Brooks, Cameron & Huebsch, PLLC

(57) ABSTRACT

Systems, methods, and apparatuses are provided for drift compensation for codewords in memory. A memory device comprises memory cells and circuitry configured to sense a codeword stored in the array of memory cells using a reference voltage and determine an amount by which to adjust the reference voltage used to sense the codeword based on an estimated weight of the original codeword, a mean of threshold voltage values of each memory cell of the sensed codeword, and a total quantity of memory cells of the sensed codeword. The circuitry can further be configured to adjust the reference voltage used to sense the codeword by the determined amount.

24 Claims, 6 Drawing Sheets

(51) Int. Cl.
    *G11C 11/4099*     (2006.01)
    *G11C 11/56*     (2006.01)

(56) References Cited

U.S. PATENT DOCUMENTS

| | | |
|---|---|---|
| 9,633,740 B1* | 4/2017 | Alhussien ............ G11C 7/1006 |
| 10,431,301 B2 | 10/2019 | Mirichigni et al. |
| 10,566,052 B2* | 2/2020 | Mirichigni ......... G11C 13/0033 |
| 10,714,185 B2 | 7/2020 | Sforzin et al. |
| 10,976,936 B2 | 4/2021 | Sforzin et al. |
| 11,164,619 B2 | 11/2021 | Sforzin et al. |
| 2014/0129872 A1* | 5/2014 | Bueb .................. G06F 11/0793 |
| | | 714/2 |
| 2014/0365836 A1* | 12/2014 | Jeon ..................... G11C 29/028 |
| | | 714/721 |
| 2022/0076738 A1* | 3/2022 | Bazarsky ............ G11C 11/5628 |
| 2022/0321147 A1* | 10/2022 | Laurent .................. G11C 29/42 |
| 2022/0365706 A1* | 11/2022 | Yang ...................... G11C 29/76 |
| 2024/0053902 A1* | 2/2024 | Laurent ................ G06F 3/0673 |
| 2024/0071434 A1* | 2/2024 | Sforzin ................ G11C 7/1069 |

OTHER PUBLICATIONS

Schouhamer Immink, et al., "Dynamic Threshold Detection Based on Pearson Distance Detection", IEEE Transactions on Communications, issue 7, vol. 66, Jul. 2018, pp. 2958-2965.

* cited by examiner

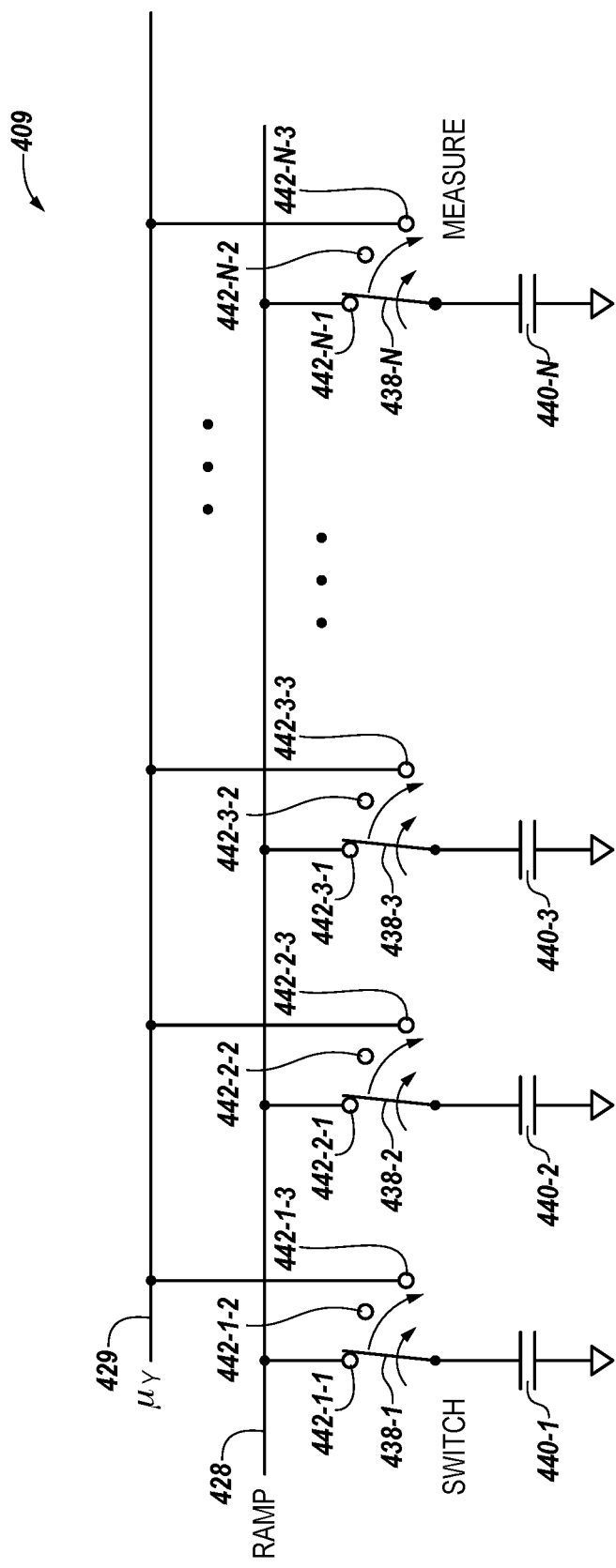

544 ─►

```
┌─────────────────────────────────────────────────────────────┐
│  SENSE A CODEWORD STORED IN AN ARRAY OF MEMORY CELLS        │─ 546
│  OF A MEMORY DEVICE USING A REFERENCE VOLTAGE               │
└─────────────────────────────────────────────────────────────┘
                              │
┌─────────────────────────────────────────────────────────────┐
│           DETERMINE AN AMOUNT BY WHICH TO ADJUST            │
│  THE REFERENCE VOLTAGE USED TO SENSE THE CODEWORD           │
│  BASED ON AN ESTIMATED WEIGHT OF THE SENSED CODEWORD,       │─ 548
│  A MEAN OF THRESHOLD VOLTAGE VALUES OF EACH MEMORY CELL     │
│  OF THE SENSED CODEWORD, AND A TOTAL QUANTITY               │
│  OF MEMORY CELLS OF THE SENSED CODEWORD                     │
└─────────────────────────────────────────────────────────────┘
                              │
┌─────────────────────────────────────────────────────────────┐
│     ADJUST THE REFERENCE VOLTAGE USED TO SENSE              │─ 550
│     THE CODEWORD BY THE DETERMINED AMOUNT                   │
└─────────────────────────────────────────────────────────────┘
```

*FIG. 5*

DRIFT COMPENSATION FOR CODEWORDS IN MEMORY

PRIORITY INFORMATION

This application claims the benefit of U.S. Provisional Application Ser. No. 63/402,338 filed on Aug. 30, 2022, the contents of which are incorporated herein by reference.

TECHNICAL FIELD

The present disclosure relates generally to semiconductor memory and methods, and more particularly, to drift compensation for codewords in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor) or can store data based on their conductivity state. Such memory cells can be programmed to store data corresponding to a target data state by varying the charge level of the storage element (e.g., different levels of charge of the capacitor may represent different data sates) or by varying the conductivity level of the storage element. For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one data bit).

BRIEF DESCRIPTION OF THE DRAWINGS

FIG. 4 illustrates circuitry for determining the mean threshold voltage value of memory cells corresponding to data bits in a codeword in accordance with an embodiment of the present disclosure.

FIG. 5 is a flow diagram of an example method for drift compensation for codewords in memory in accordance with an embodiment of the present disclosure.

DETAILED DESCRIPTION

Figure 1A:
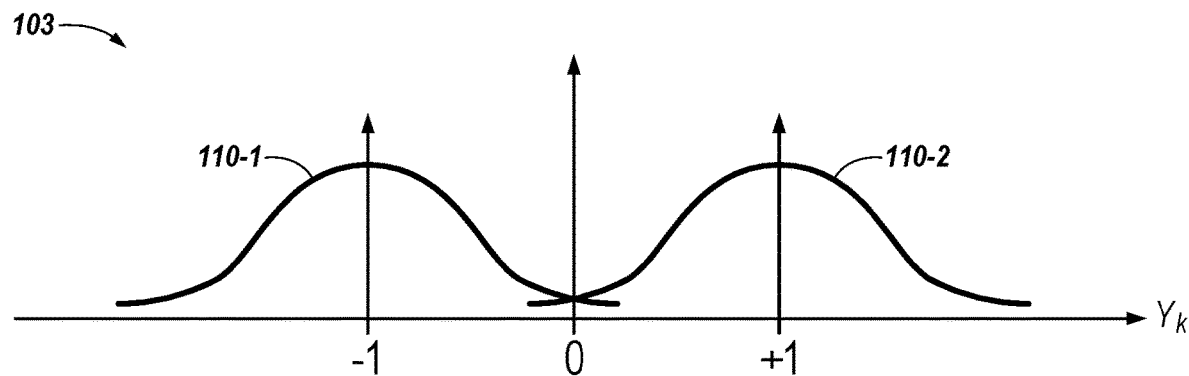
FIGS. 1A and 1B illustrate diagrams of a number of threshold voltage distributions, sensing voltages, and data assignments associated with a group of memory cells in accordance with an embodiment of the present disclosure.

The present disclosure includes apparatuses, methods, and systems for drift compensation for codewords in memory. An embodiment includes a memory device comprising an array of memory cells and circuitry configured to sense a codeword stored in the array of memory cells using a reference voltage, determine an amount by which to adjust the reference voltage used to sense the codeword based on an estimated weight of the original codeword, a mean of threshold voltage values of each memory cell of the sensed codeword, and a total quantity of memory cells of the sensed codeword. The circuitry is further configured to adjust the reference voltage used to sense the codeword by the determined amount.

A memory device can address memory cells for operations (e.g., sense and program operations) in groups (e.g., packets) called words or codewords. As memory cells are sensed and programmed, their response to positive or negative electrical pulses can change cycle after cycle (e.g., according to a specific electrical bias history of the codeword to which they belong).

For example, when performing a sense operation (e.g., a read operation), a memory device may access a memory cell, which may output a signal to sense circuitry that can correspond to the data state of the memory cell (e.g., to a value stored by the memory cell). To determine the data state of the memory cell, the sense circuitry may compare the signal output by the memory cell to a reference signal, which may be, for instance, a reference voltage. The reference voltage may correspond to a voltage positioned between an expected voltage level of the signal output by a memory cell programmed to a first data state (e.g., storing a first logic value) and an expected voltage level of the signal output by a memory cell programmed to a second data state (e.g., storing a second logic value). For instance, the sense circuitry may determine that the memory cell has been programmed to a first data state if the signal output by the memory cell is less than the reference voltage, and that the memory cell has been programmed to a second data state if the signal output by the memory cell is greater than the reference voltage.

If, however, the memory cell experiences threshold voltage drift, the threshold voltage value of the memory cell may change such that the signal output by the memory cell during a sense operation does not correspond to the data state to which the memory cell was programmed (e.g., is no longer the expected value of a signal output by a memory cell programmed to that data state). As used herein, "drift" refers to a difference between the programmed threshold voltage value of a memory cell and the sensed threshold voltage value of the memory cell. Threshold voltage drift can occur in a memory cell after multiple operations (e.g., multiple read cycles) are performed on the memory cell and/or due to temperature variations in the memory cell, for example. Threshold voltage drift can lead to an incorrect read in a memory cell. For instance, threshold voltage drift may result in the memory cells of a codeword being sensed to be in states to which they were not actually programmed (e.g., a cell programmed to be in the first data state may be erroneously sensed to be in the second data state, and/or vice versa). Such erroneous data sensing can reduce the performance and/or lifetime of the memory.

Embodiments of the present disclosure, however, can compensate for threshold voltage drift that may occur in the memory cells of a codeword, such that the data states of the memory cells of the codeword can be accurately determined. For example, embodiments of the present disclosure can determine the amount (e.g., voltage amount) by which a reference voltage should be adjusted to compensate for the threshold voltage drift when sensing the data states of memory cells in a codeword. Accordingly, embodiments of the present disclosure can increase the performance and/or lifetime of memory that utilizes codewords (e.g., by using a reference voltage that will accurately sense the data states of memory cells in a codeword that has been affected by threshold voltage drift).

As used herein, "a," "an," or "a number of" can refer to one or more of something, and "a plurality of" can refer to two or more such things. For example, a memory device can refer to one or more memory devices, and a plurality of memory devices can refer to two or more memory devices. Additionally, the designator "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1B:
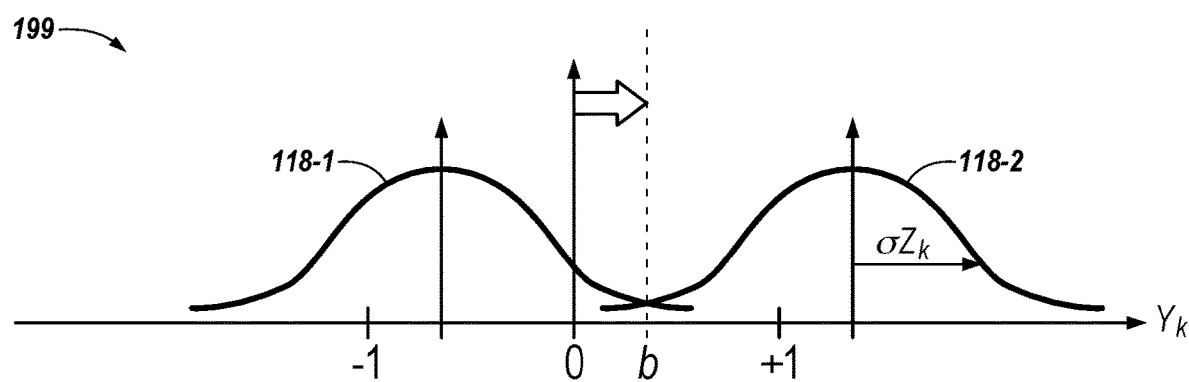

FIGS. 1A and 1B illustrate diagrams of a number of threshold voltage (Vt) distributions, sensing voltages, and data assignments associated with a group of memory cells in accordance with an embodiment of the present disclosure. The group of memory cells can be, for example, a codeword, which can refer to a logical unit of a memory device used to store data. FIG. 1A illustrates a diagram 103 of Vt distributions 110-1 and 110-2 associated with the data states of the memory cells of a codeword before the memory cells of the codeword have experienced threshold voltage drift, and FIG. 1B illustrates a diagram 199 of Vt distributions 118-1 and 118-2 associated with codeword after the memory cells of the codeword have experienced threshold voltage drift.

As an example, the two Vt distributions 110-1 and 110-2 shown in FIG. 1A, and the two Vt distributions 118-1 and 118-2 shown in FIG. 1B, can correspond to single level (e.g., two-state) memory cells. However, embodiments of the present disclosure are not limited to single level memory cells. For example, embodiments of the present disclosure can include multilevel cells such as, for instance, triple level cells (TLCs), or quadruple level cells (QLCs). In such examples, the diagrams illustrated in FIGS. 1A and 1B would include additional Vt distributions (e.g., corresponding to each of the additional data states).

Vt distributions 110-1 and 110-2 shown in FIG. 1A, and Vt distributions 118-1 and 118-2 shown in FIG. 1B, represent two target data states (e.g., 1 and 0, respectively, which are represented in FIGS. 1A and 1B by −1 and 1, respectively) to which the memory cells of the group can be programmed. Embodiments of the present disclosure, however, are not limited to these data assignments.

Vt distributions 110-1 and 110-2 shown in FIG. 1A, and Vt distributions 118-1 and 118-2 shown in FIG. 1B, can represent a quantity (e.g., number) of memory cells of the group that are programmed to the corresponding target states (e.g., 1 and 0), with the height of a Vt distribution curve indicating the quantity of cells programmed to a particular voltage within the Vt distribution (e.g., on average). The width of the Vt distribution curve indicates the range of voltages that represent a particular target state (e.g., the width of the Vt distribution curves 110-2 and 118-2 represent the range of voltages that correspond to a data value of 0 for the original codeword (e.g. before the codeword has experienced threshold voltage drift) and the codeword after it has experienced threshold voltage drift, respectively). In the example illustrated in FIG. 1A (e.g., the original codeword), the widths and heights of Vt distributions 110-1 and 110-2 are equivalent (e.g., equal). Further, in the example illustrated in FIG. 1B (e.g., the codeword that has experienced drift), the widths and heights of Vt distributions 118-1 and 118-2 are equivalent.

During a sense (e.g., read) operation to determine the respective data states stored by the memory cells of the group, a reference voltage located between the two Vt distributions (e.g., at location 0 illustrated in FIG. 1A) can be used to distinguish between the two data states (e.g., between states 1 and 0). For example, during a sense operation performed on a selected memory cell of the group, a sense voltage can be applied to first signal line (e.g., an access line) to which the memory cell is coupled, and the resulting voltage signal (e.g. in response to the sense voltage being applied to the access line) from the memory cell can be provided to sense circuitry via a second signal line (e.g., a sense line) to which the memory cell is coupled for comparison with the reference voltage. The data state for the selected memory cell can be determined using (e.g., by comparing) the voltage signal from that memory cell and the reference voltage.

In the examples illustrated in FIGS. 1A and 1B, the reference voltage used to distinguish between the two data states can be determined by averaging the threshold voltages of the memory cells of the group (e.g., codeword). For the original codeword (e.g., whose cells have not experienced threshold voltage drift), this reference voltage would be located exactly between its Vt distributions 110-1 and 110-2 at 0, as illustrated in FIG. 1A. However, for the codeword whose memory cells have experienced drift, this reference voltage would be located exactly between its Vt distributions 118-1 and 118-2 at b instead of 0, which is illustrated in FIG. 1B. As such, using 0 as the reference voltage to sense the data states of the memory cells of the codeword that has experienced drift may result in some cells of that codeword being sensed to be in a state to which they were not actually programmed. For instance, a cell programmed to a target state of 1, but whose voltage is to the right of 0 (e.g., the reference voltage in FIG. 1A) within distribution 118-1, may be erroneously sensed to be in state 0.

Embodiments of the present disclosure, however, can compensate for this threshold voltage drift by determining (e.g., estimating) the amount (e.g., voltage amount) by which the reference voltage should be adjusted to accurately sense the data states of the memory cells of the codeword that has experienced threshold voltage drift. Estimating the value of the reference voltage that will accurately sense the data states of the memory cells of the codeword can reduce the likelihood of the data states of the memory cells of the codeword being read incorrectly when the memory cells have experienced threshold voltage drift.

Figure 2:
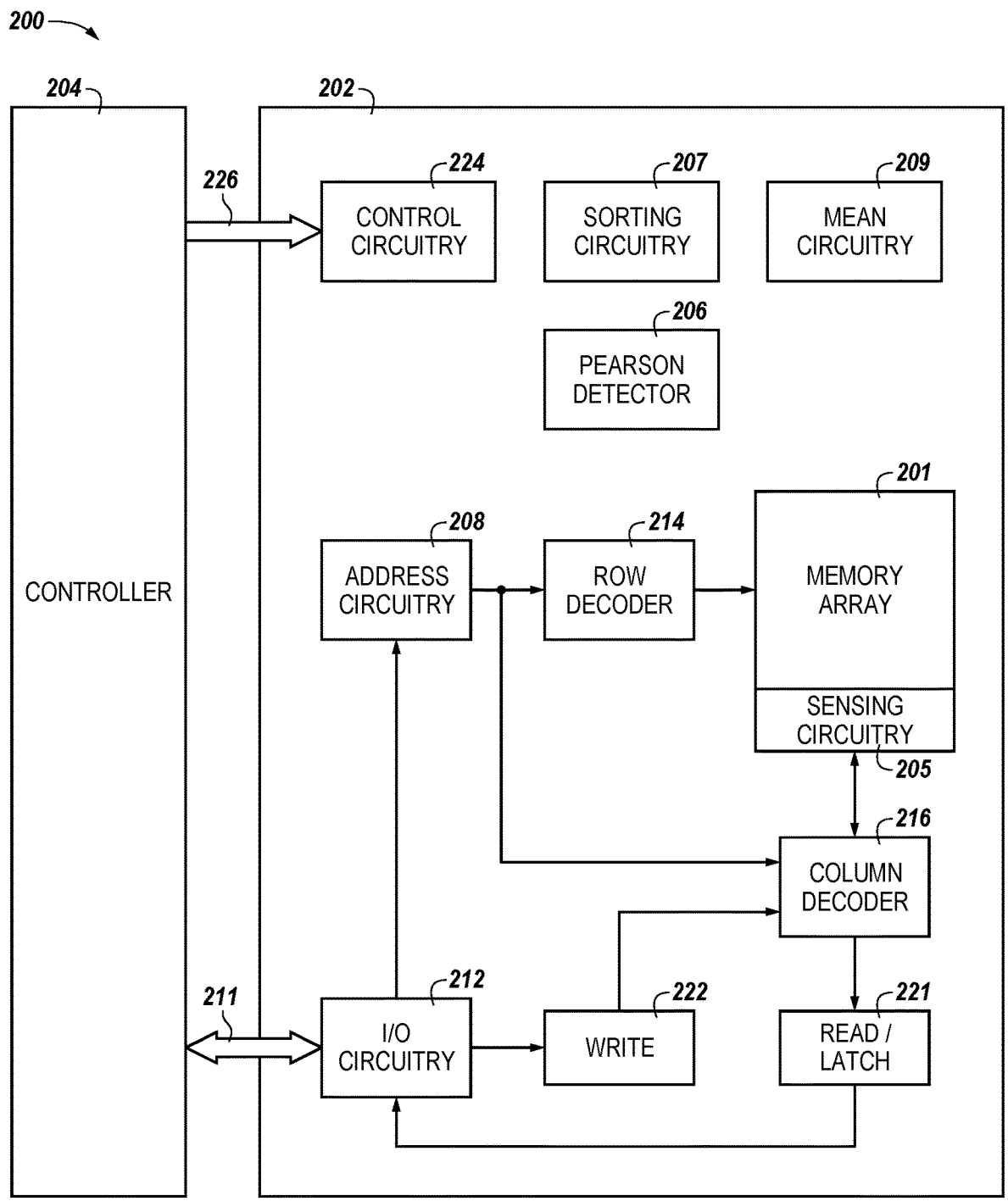
FIG. 2 is a block diagram illustration of an example apparatus in accordance with an embodiment of the present disclosure.

FIG. 2 is a block diagram illustration of an example apparatus, such as an electronic memory system 200, in accordance with an embodiment of the present disclosure. Memory system 200 may include an apparatus, such as a memory device 202 and a controller 204, such as a memory controller (e.g., a host controller). Controller 204 might include a processor, for example. Controller 204 might be coupled to a host, for example, and may receive command signals (or commands), address signals (or addresses), and data signals (or data) from the host and may output data to the host.

Memory device 202 includes a memory array 201 of memory cells. For example, memory array 201 can include a group of memory cells, such as a codeword, as previously described herein (e.g., in connection with FIGS. 1A-1B). Memory array 201 can be, for example, a DRAM array, such as, for instance, a ferroelectric memory (e.g., FeRAM) array. That is, the memory cells of array 201 can be DRAM (e.g., FeRAM) cells. However, embodiments are not limited to a particular type of memory array. For instance, in some embodiments (e.g., embodiments in which non-destructive read operations are performed on the memory cells of array 201), memory array 201 can be a NAND flash array (e.g., the memory cells of array 201 can be NAND flash memory cells). As an additional example, in some embodiments (e.g., embodiments in which destructive read operations are performed on the memory cells of array 201), memory array 201 can be a self-selecting memory array (e.g., the memory cells of array 201 can comprise a single material that serves as both a select element and a storage element). Further, although one memory array 201 is illustrated in FIG. 2 for simplicity and so as not to obscure embodiments of the present disclosure, memory device 202 can include a number of memory arrays analogous to array 201.

Memory device 202 may include address circuitry 208 to latch address signals provided over I/O connections 211 through I/O circuitry 212. Address signals may be received and decoded by a row decoder 214 and a column decoder 216 to access the memory array 201. For example, row decoder 214 and/or column decoder 216 may include drivers.

Controller 204 may sense (e.g., read) data in memory array 201, such as a codeword stored in array 201, by using read/latch circuitry 221 and/or sensing circuitry 205. Read/latch circuitry 221 may read and latch data from the memory array 201. Sensing circuitry 205 may include a number of sense amplifiers coupled to memory cells of memory array 201, which may operate in combination with the read/latch circuitry 221 to sense (e.g., read) memory states from targeted memory cells. I/O circuitry 212 may be included for bi-directional data communication over the I/O connections 211 with controller 204. Write circuitry 222 may be included to program (e.g., write) data to memory array 201.

Control circuitry 224 may decode signals provided by control connections 226 from controller 204. These signals may include chip signals, write enable signals, and address latch signals that are used to control the operations on memory array 201, including data read and data write operations. Control circuitry 224 may be included in controller 204, for example. Controller 204 may include other circuitry, firmware, software, or the like, whether alone or in combination. Controller 204 may be an external controller (e.g., in a separate die from the memory array 201, whether wholly or in part) or an internal controller (e.g., included in a same die as the memory array 201). For example, an internal controller might be a state machine or a memory sequencer.

The memory device 202 can also include circuitry configured to determine (e.g., estimate) the amount by which to adjust a reference voltage used to sense the states of memory cells in a codeword such that the reference voltage will accurately sense the data states of the memory cells in the codeword that have experienced threshold voltage drift. For example, the memory device 202 can include sorting circuitry 207, mean circuitry 209, and a Pearson detector 206. The sorting circuitry 207 can sort the data bits (e.g., the threshold voltage values of the memory cells) of the codeword into different voltage distributions, the mean circuitry 209 can determine a mean threshold voltage value of the memory cells corresponding to the data bits in the codeword, and Pearson detector 206 can determine the weight of the originally programmed data of the codeword (e.g., the weight of the data bits in the originally programmed codeword). In some embodiments, the sorting circuitry 207, mean circuitry 209, and Pearson detector 206 can be included in (e.g., located on) a controller (e.g., controller 204) instead of the memory device 202. Sorting circuitry 207 will be further described herein (e.g., in connection with FIG. 3) and mean circuitry 209 will be further described herein (e.g., in connection with FIG. 4).

Determining the amount by which to adjust the reference voltage such that the reference voltage will accurately sense the data state of the memory cells of the codeword that has experienced threshold voltage drift includes estimating the weight of the originally programmed codeword. The codeword that has experienced threshold voltage drift can be referred to as the sensed codeword. The sensed codeword can comprise a sensed data value of each of the memory cells of the sensed codeword. The originally programmed data of the codeword can include the programmed data value of each of the memory cells of the codeword (e.g., corresponding to the data bits in the originally programmed codeword). The estimated weight of the original codeword can be referred to as the weight estimator. As used herein, the term "weight" refers to the number of data bits with a particular data value (e.g., the number bits with a value of 1) in a codeword. The estimated weight of the original codeword can be a Pearson estimate of the weight of the codeword and can be determined by Pearson detector 206.

In some embodiments, the weight estimator can be used to determine an estimated offset of the sensed codeword. As used herein, the term "offset" refers to the amount by which the threshold voltage values of the memory cells of the sensed codeword have changed after the memory cells have experienced threshold voltage drift. The value of the estimated offset can be the amount by which to adjust the reference voltage used to sense the codeword such that the reference voltage can accurately sense the data states of the memory cells of the sensed codeword. The estimated offset be determined based on the estimated weight of the original codeword, the mean of the threshold voltage values of each memory cell of the sensed codeword, and the total quantity of memory cells of the sensed codeword. For example, the estimated offset can be determined by the following equation:

$$\hat{b} = \overline{Y} - 1 + \frac{2\hat{w}_p}{N}$$

In the foregoing equation, the estimated offset is represented by the symbol b. The equation states that the estimated offset can be determined by adding a difference between the mean of the sorted threshold voltage values, represented in the foregoing equation by the symbol $\overline{Y}$, and a value of 1, to a value that is twice the weight estimator, represented by the symbol $\hat{w}_p$, divided by the total quantity of memory cells of the codeword, represented by the symbol "N."

In some embodiments, when the quantity of memory cells in a first distribution (e.g., first distribution 336-1 described later in FIG. 3) is above a threshold quantity of memory cells, the amount by which to adjust the reference voltage can correspond to a value given by a sum of the threshold voltage values of each memory cell of the sensed codeword whose threshold voltage value is in a range of threshold voltage value positions in the sensed codeword individually added to a value of 1 and dividing that sum by the delta value. The first distribution can represent a quantity (e.g., number) of memory cells of a group that are programmed to a specific data state (e.g., 1 and 0). For example, the estimated offset can be given by the following equation:

$$\hat{b} = \frac{1}{d} \sum_{k=m_L}^{m_R} \left( Y_{k:N} + 1 \right)$$

In the foregoing equation, the estimated offset is represented by the symbol b. The equation states that the estimated offset can be determined by adding a sum of the threshold voltage values of each memory cell in a range of threshold voltage value positions of the codeword individually to a value of 1, represented by the symbol $$\sum_{k=m_L}^{m_R} (Y_{k:N} + 1),$$

and dividing that sum by the delta value, represented by the symbol "d."

In some embodiments, the delta value can be determined by adding a value of 1 to a difference between a second position in the range of threshold voltage value positions and a first position in the range of threshold voltage value positions. The delta value can correspond to an amount of time and an amount of energy used in determining the amount by which to adjust the reference voltage. In some embodiments, the first position in the range of threshold voltage value positions can be greater than or equal to a value of 1. Further, the first position can be less than or equal to the second position in the range of threshold voltage value positions and the second position can be less than a threshold value of the estimated weight.

The process for sorting the data bits (e.g., the threshold voltage values of the memory cells) in the sensed codeword in ascending order (e.g., based on the threshold voltage value of the corresponding memory cell) is described in connection with FIG. 3 and the process for determining the mean of the sorted threshold voltage values is described in connection with FIG. 4.

Figure 3:
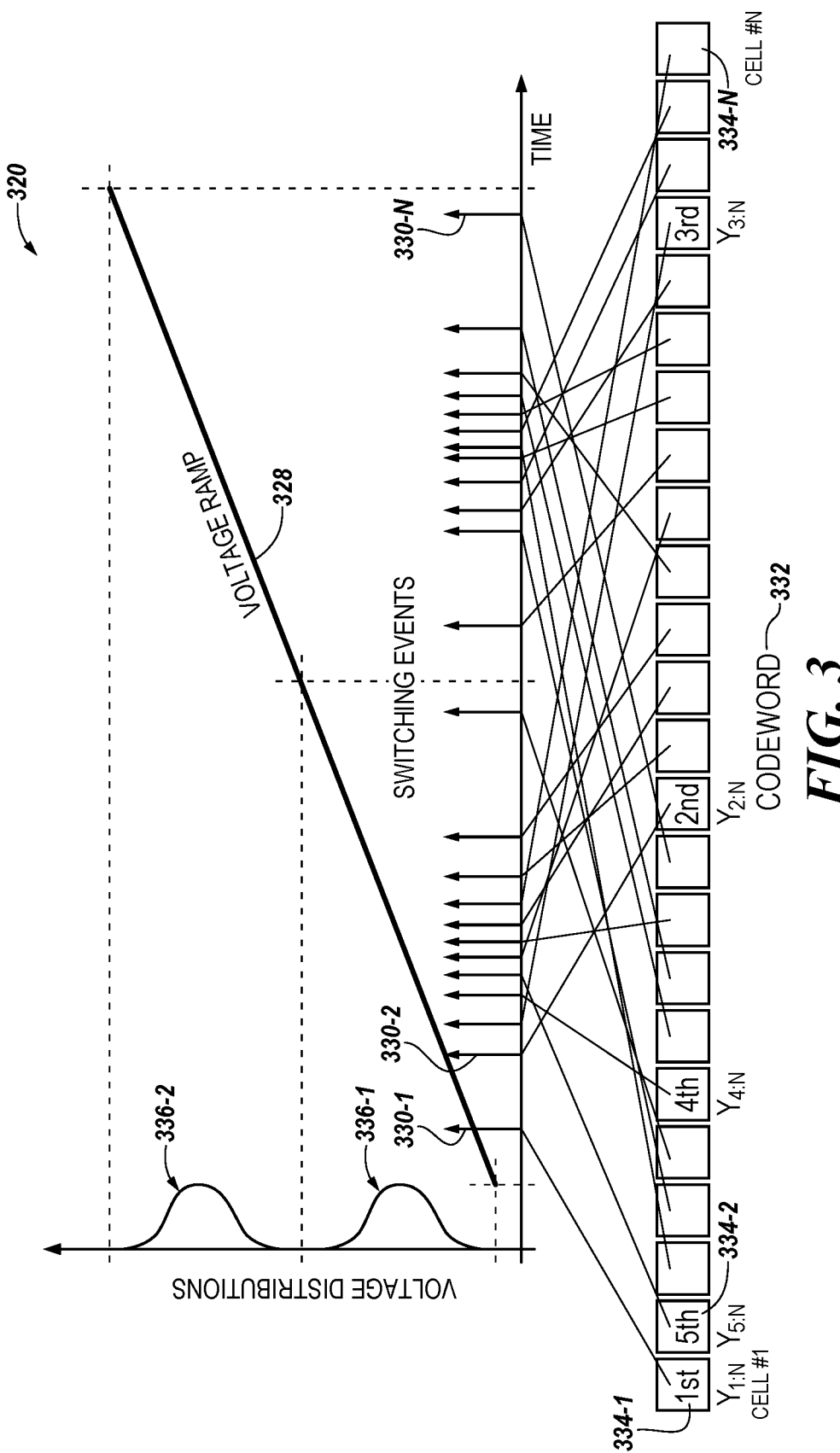
FIG. 3 is a diagram illustrating voltage distributions and corresponding data bits in a codeword in accordance with an embodiment of the present disclosure.

FIG. 3 is a diagram illustrating voltage distributions and corresponding data bits in a codeword in accordance with an embodiment of the present disclosure. FIG. 3 illustrates a diagram 320 including a ramp voltage 328, switching event times 330-1, 330-2, . . . , 330-N (individually or collectively referred to as switching event times 330) of data bits 334-1, 334-2, . . . , 334-N (individually or collectively referred to as data bits 334) in a codeword 332. The diagram 320 also includes voltage distributions 336-1 and 336-2.

Diagram 320 includes switching event times 330 for data bits 334 of a codeword 332 (e.g., switching event time 330-1 for data bit 334-1, switching event time 330-2 for data bit 334-2, etc.). As used herein, the term "switching event" refers to an occurrence of a memory cell changing from a low conductive state to a high conductive state, or a high conductive state to a low conductive state, in response to receiving a current that has a voltage that is greater than or equal to the threshold voltage of the memory cell. In some embodiments, applying the ramped up voltage 328 (e.g., a voltage that increases with time) to each of the memory cells can initiate a switching event in each of the memory cells at different times. For instance, in the example illustrated in FIG. 3, the memory cell of the codeword corresponding to data bit 334-1 (e.g., $Y_{1:N}$) is the first cell to switch (at switching event time 330-1), the memory cell of the codeword corresponding to data bit $Y_{2:N}$ is the second cell to switch (at switching event time 330-2), and the memory cell of the codeword corresponding to data bit 334-2 is the fifth cell to switch. The threshold voltage value of each of the memory cells can be determined after the switching event occurs in that respective memory cell.

In some embodiments, circuitry (e.g., sorting circuitry 207 in FIG. 2) can sort the threshold voltage values of each of the memory cells in ascending order (e.g., from lowest to highest). Further, the sorted threshold voltage values can be divided into a first distribution 336-1 and second distribution 336-2, with the first distribution including the lower threshold voltage values (e.g., the cells of the codeword with the shorter switching times) and the second distribution including the higher threshold voltage values (e.g., the cells of the codeword with the longer switching times). In some embodiments, the sorted threshold voltages are divided into the first distribution 336-1 and the second distribution 336-2 such that the quantity of threshold voltage values in the first distribution 336-1 is equal to the estimated weight of the codeword 332. Further, the sorted threshold voltage values can be divided into the first distribution 336-1 and the second distribution 336-2 such that the quantity of the threshold voltage values in the second distribution 336-2 is equal to a difference between the quantity of memory cells in the codeword 332 and the quantity of the threshold voltage values in the first distribution 336-1.

In some embodiments, a bit of a sensed codeword can be in the first distribution 336-1 when a position of the threshold voltage of the memory cell corresponding to that bit is less than a determined amount by which to adjust the reference voltage. Further, a bit of a sensed codeword can be in the second distribution 336-2 when a position of the threshold voltage of the memory cell corresponding to that bit is greater than or equal to the amount by which to adjust the reference voltage.

FIG. 4 illustrates circuitry for determining the mean threshold voltage value of memory cells corresponding to data bits in a codeword in accordance with an embodiment of the present disclosure. Circuitry 409 can be, for instance, circuitry 209 previously described in connection with FIG. 2. As shown in FIG. 4, circuitry 409 includes a mean voltage line 429, a ramp voltage line 428, switches 438-1, 438-2, 438-3, . . . , 438-N (individually or collectively referred to as switches 438), connectors 442-1-1, 442-1-2, 442-1-3, . . . , 442-N-1, 442-N-2, and 442-N-3 (individually or collectively referred to as connectors 442), and capacitors 440-1, 440-2, 440-3, . . . , 440-N (individually or collectively referred to as capacitors 440).

Each respective one of the plurality of switches 438 can be configured to couple a different one of the memory cells of memory array 201 previously described in connection with FIG. 2 to a different one of a plurality of connectors 442. The ramped voltage line 428 can output a ramped voltage (e.g., ramped voltage 328 previously described in connection with FIG. 3), and each of the memory cells can be coupled to the ramped voltage via the ramp voltage line 428 when its respective switch 438 is coupled to a first connector 442-1-1, 442-2-1, 442-3-1, . . . , 442-N-1 of the plurality of connectors 442 (e.g., the memory cell coupled to switch 438-1 can be coupled to ramp voltage line 428 when switch 438-1 is coupled to first connector 442-1-1, the memory cell coupled to switch 438-2 can be coupled to ramp voltage line 428 when switch 438-2 is coupled to first connector 442-2-1, etc.). In some embodiments, each of the plurality of switches 438 can be coupled to its respective first connector (e.g., to the ramp voltage line 428) until its corresponding memory cell reaches its threshold voltage. Each memory cell that is coupled to the ramp voltage line 428 may experience a switching event when it reaches its threshold voltage.

In some embodiments, each respective one of the plurality of switches 438 can be configured to decouple from the first connector 442-1-1, 442-2-1, 442-3-1, . . . , 442-N-1 and couple to a second connector 442-1-2, 442-2-2, 442-3-2, . . . , 442-N-2 of the plurality of connectors once its respective memory cell experiences a switching event (e.g., switch 438-1 can decouple from first connector 442-1-1 and couple to second connector 442-1-2 once the memory cell coupled to switch 438-1 experiences a switching event, switch 438-2 can decouple from first connector 442-2-1 and couple to second connector 442-2-2 once the memory cell coupled to switch 438-2 experiences a switching event, etc.). In some embodiments, the switches 438 can couple to the second connector 442-1-2, 442-2-2, 442-3-2, . . . , 442-N-2 to store the voltage level of the corresponding memory cells (e.g., the threshold voltage of the memory cells when they experience the switching event) in capacitors 440. For example, once the memory cell that is coupled to switch 438-1 reaches its threshold voltage and experiences a switching event, switch 438-1 can decouple from the first connector 442-1-1 and couple to the second connector 442-1-2 to store the voltage of that memory cell in capacitor 440-1, while the other switches 438 can remain connected to their respective first connector.

In some embodiments, each respective one of the plurality of switches 442 can be configured to decouple from the second connector 442-1-2, 442-2-2, 442-3-2, . . . , 442-N-2 and couple to a third connector 442-1-3, 442-2-3, 442-3-3, . . . , 442-N-3 of the plurality of connectors once each (e.g., every) memory cell experiences a switching event. As shown in FIG. 4, coupling the switches 438 to the third connector 442-1-3, 442-2-3, 442-3-3, . . . , 442-N-3 couples the switches 438, and therefore the capacitors 440, to the mean voltage line 429. In some embodiments, each of the plurality of switches 438 can be configured to couple to its respective third connector 442-1-3, 442-2-3, 442-3-3, . . . , 442-N-3 simultaneously. In some embodiments, each of the memory cells can be coupled to a common node when each of the plurality of switches 438 is coupled to its respective third connector 442-1-3, 442-2-3, 442-3-3, . . . , 442-N-3.

Controller 204 and/or control circuitry 224 previously described in connection with FIG. 2 can be configured to determine the mean of the threshold voltage values of the memory cells when each of the plurality of switches 438 is coupled to its respective third connector 442-1-3, 442-2-3, 442-3-3, . . . , 442-N-3. The controller and/or control circuitry can determine the mean of the threshold voltage values of the memory cells by measuring the total voltage value stored by the capacitors 440 coupled to the mean voltage line 429 and dividing that value by the number of memory cells.

FIG. 5 is a flow diagram of an example method 544 for drift compensation for codewords in memory in accordance with an embodiment of the present disclosure. The method 544 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. As an example, the method 544 can be performed by controller 204 and/or control circuitry 224 previously described in FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 546, the method 544 can include sensing a codeword stored in an array of memory cells of a memory device (e.g., array 201 of memory device 202 previously described in connection with FIG. 2) using a reference voltage. The sensed codeword can comprise a sensed data value of each of the memory cells of the sensed codeword. As stated earlier, the bits of the sensed codeword can be separated into a first distribution and a second distribution.

At block 548, the method 544 can include determining an amount by which to adjust the reference voltage used to sense the codeword based on an estimated weight of the original codeword, a mean of the threshold voltage values of each memory cell of the sensed codeword, and a total quantity of memory cells of the sensed codeword. In some embodiments, the estimated weight of the original codeword can be a Pearson estimate of the weight of the original codeword that is determined by a Pearson detector (e.g., Pearson detector 206 previously described in connection with FIG. 1). Further, the value of every bit in the sensed codeword can be changed to an opposite bit value when the estimated weight of the original codeword is below a threshold weight. In some embodiments, the threshold weight can be half the total quantity of bits in the sensed codeword.

Further, a value of an additional bit can be set to a first value in response to the value of every bit in the sensed codeword changing to the opposite bit value, and the value of the additional bit can be set to a second value in response to the value of every bit in the sensed codeword not changing to the opposite bit value. For example, if the weight of the sensed codeword is less than the threshold weight, every bit in the sensed codeword can change to the opposite bit value and the additional bit can be set to a value of 1. Alternatively, if the weight of the sensed codeword is greater than or equal to the threshold weight, the bits of the codeword retain their value and the additional bit is set to a value of 0. The additional bit can be a bit that is external to the sensed codeword. In some embodiments (e.g., embodiments in which the memory cells of the sensed codeword are self-selecting memory cells), the polarization of the memory cells can change from a first polarization to a second polarization when the value of every bit in the sensed codeword changes to the opposite bit value. As used herein, the term "polarization" refers to an orientation of chalcogenide material in a memory cell. For example, the chalcogenide material of each memory cell can change from an amorphous state to a crystalline state, or vice versa, when the value of every bit in the sensed codeword changes to the opposite bit value.

At block 550, the method 544 can include adjusting the reference voltage used to sense the codeword by the determined amount. If the weight of the sensed codeword is greater than or equal to the threshold weight, the amount by which to adjust the reference voltage can be determined using threshold voltage values included in a distribution of threshold voltage values of memory cells that are in a first data state and excluding threshold voltage values that are included in a distribution of threshold voltage values of memory cells that are in a second data state. For example, the amount by which to adjust the reference voltage can be determined by using the threshold voltage values included in distribution 336-1 in FIG. 3 that are in data state 0 and excluding threshold voltage values that are included in distribution 336-2 in FIG. 3 that are in data state 1.

Figure 6:
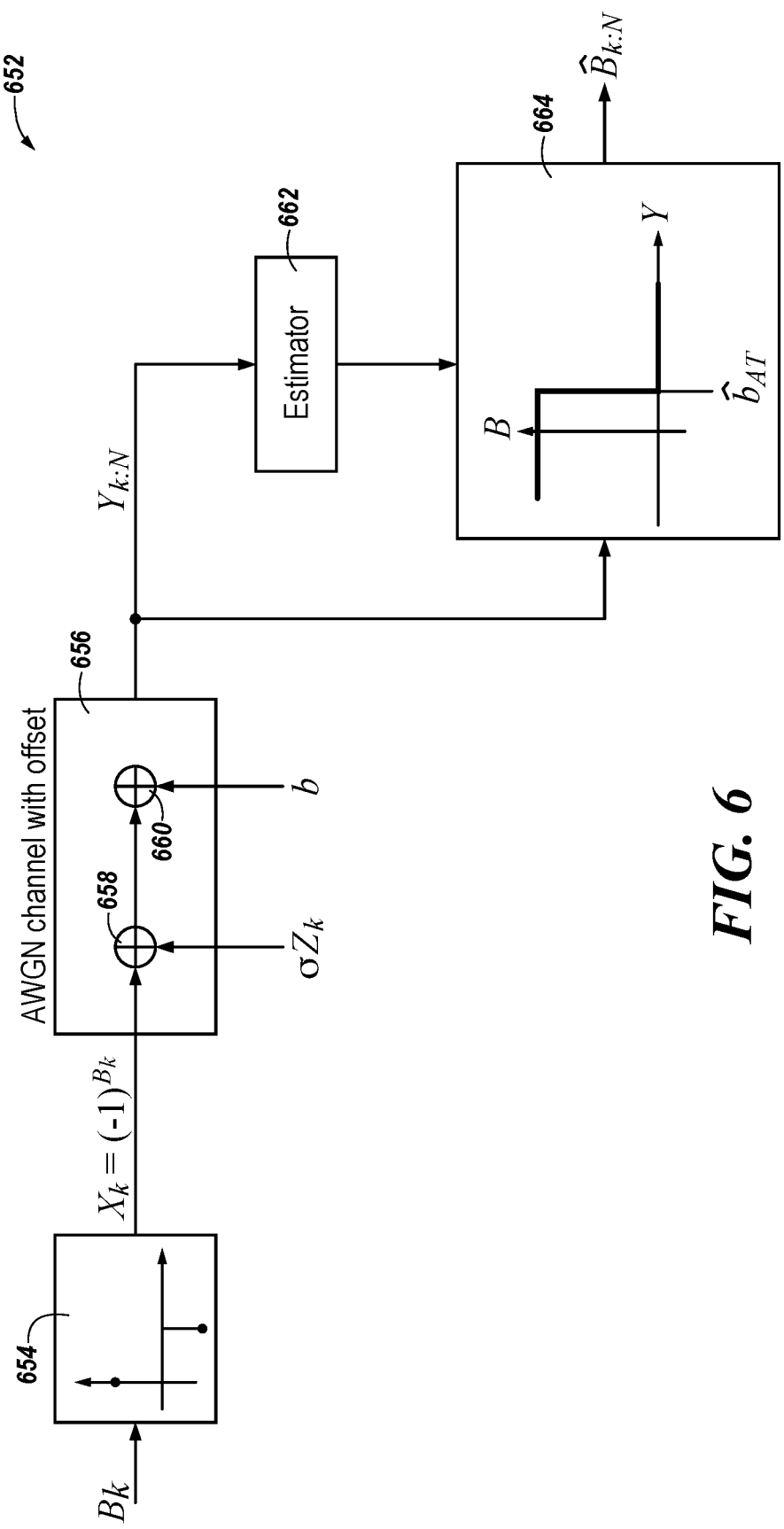
FIG. 6 is a block diagram illustration of circuitry for detecting and compensating for threshold voltage drift in accordance with an embodiment of the present disclosure.

FIG. 6 is a block diagram illustration of circuitry 652 for detecting and compensating for threshold voltage drift in accordance with an embodiment of the present disclosure. The circuitry 652 can include an Additive White Gaussian Noise (AWGN) channel with an offset (channel for simplicity) 656 and weight estimator circuitry 662.

A binary input sequence (e.g., original codeword), represented by the symbol $B_k$, is shown being input to box 654. Box 654 is a representation of threshold voltages of memory cells of the binary input sequence that have experienced threshold voltage drift. The binary input sequence and box 654 are included only to show that an original codeword can experience threshold voltage drift. Therefore, the binary input sequence and box 654 are not considered to be included in the architecture of the circuitry 652.

FIG. 6 further illustrates an antipodal version of the binary input sequence (e.g., antipodal codeword), represented by the symbol $X_k$, that is input into channel 656. As used herein, the term "antipodal version of the binary input sequence" refers to an input sequence in which every bit has been flipped to an opposite value relative to the original codeword. For example, every bit that has a value of 1 in the original codeword will have a value of 0 in the antipodal version of the input sequence and every bit that has a value of 0 in the original codeword has a value of 1 in the antipodal version of the original codeword.

The channel 656 can include a value of the noise 658 in the antipodal codeword (e.g., in the antipodal version of the original codeword) and an offset value 660. The antipodal codeword can be processed in the channel 656, and then be input to weight estimator circuitry 662. The weight estimator circuitry 662 can be configured to estimate the weight of the original codeword as described in connection with FIG. 2. After the weight estimator circuitry 662 estimates the weight of the original codeword, the estimated weight of the original codeword can be used to find an estimated offset value, as described in connection with FIG. 2. Box 664 shows a representation of how the offset voltage that was determined affects a threshold voltage distribution of the memory cells of the codeword. Similar to box 654, box 664 is included only to illustrate a threshold voltage distribution that has experienced drift and is not considered to be included in the architecture of circuitry 652. The estimated binary sequence (e.g., estimated codeword), represented by the symbol $B_{k:N}$, can be determined using the estimated weight of the original codeword.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory device, comprising:
      an array of memory cells; and
      circuitry configured to:
         sense a codeword stored in the array of memory cells using a reference voltage; and
         determine an amount by which to adjust the reference voltage used to sense the codeword based on:
            an estimated weight of an original codeword;
            a mean of threshold voltage values of each memory cell of the sensed codeword; and
            a total quantity of memory cells of the sensed codeword; and
         adjust the reference voltage used to sense the codeword by the determined amount.

2. The apparatus of claim 1, wherein the circuitry is configured to change a value of every bit in the sensed codeword to an opposite bit value when the estimated weight of the original codeword is below a threshold weight.

3. The apparatus of claim 2, wherein the threshold weight is half of a total quantity of bits in the sensed codeword.

4. The apparatus of claim 2, wherein a polarization of the memory cells of the sensed codeword changes from a first polarization to a second polarization when the value of every bit in the sensed codeword changes to the opposite bit value.

5. The apparatus of claim 2, wherein the circuitry is configured to:
set a value of an additional bit to a first value in response to the value of every bit in the sensed codeword changing to the opposite bit value; and
set the value of the additional bit to a second value in response to the value of every bit in the sensed codeword not changing to the opposite bit value.

6. The apparatus of claim 1, wherein the sensed codeword comprises a sensed data value of each of the memory cells of the sensed codeword.

7. The apparatus of claim 1, wherein the estimated weight of the original codeword is a Pearson estimate of a weight of the sensed codeword.

8. A method, comprising:
sensing a codeword stored in an array of memory cells of a memory device using a reference voltage;
determining, by the memory device, an amount by which to adjust the reference voltage used to sense the codeword based on:
an estimated weight of the original codeword;
a mean of threshold voltage values of each memory cell of the sensed codewords; and
a total quantity of memory cells of the sensed codeword; and
adjusting the reference voltage used to sense the codeword by the determined amount.

9. The method of claim 8, further comprising determining the threshold voltage value of each respective memory cell of the sensed codeword after a switching event occurs in that respective memory cell.

10. The method of claim 9, further comprising sorting the threshold voltage values of the memory cells of the sensed codeword in ascending order.

11. The method of claim 10, further comprising dividing the sorted threshold voltage values into a first distribution and a second distribution.

12. The method of claim 11, wherein the sorted threshold voltage values are divided into the first distribution and the second distribution such that a quantity of the threshold voltage values in the first distribution is equal to the estimated weight of the original codeword.

13. The method of claim 11, wherein the sorted threshold voltage values are divided into the first distribution and the second distribution such that a quantity of the threshold voltage values in the second distribution is equal to a difference between a quantity of memory cells in the sensed codeword and a quantity of the threshold voltage values in the first distribution.

14. An apparatus, comprising:
a memory device comprising an array of memory cells; and
a controller coupled to the memory device and configured to:
sense a codeword stored in the array of memory cells using a reference voltage;
determine an amount by which to adjust the reference voltage used to sense the codeword based on:
an estimated weight of the original codeword;
a mean of threshold voltage values of each memory cell of the sensed codeword; and
a total quantity of memory cells of the sensed codeword; and
adjust the reference voltage used to sense the codeword by the determined amount.

15. The apparatus of claim 14, wherein the amount by which to adjust the reference voltage corresponds to a value given by a sum of the threshold voltage values of each memory cell of the sensed codeword whose threshold voltage value is in a range of threshold voltage value positions in the sensed codeword individually added to a value of 1 that is divided by a delta value.

16. The apparatus of claim 15, wherein the delta value is determined by adding a value of 1 to a difference between a second position in the range of threshold voltage value positions and a first position in the range of threshold voltage value positions.

17. The apparatus of claim 16, wherein the first position in the range of threshold voltage value positions is greater than or equal to a value of 1.

18. The apparatus of claim 16, wherein the first position is less than the second position in the range of threshold voltage value positions.

19. The apparatus of claim 16, wherein the second position is less than a threshold value of the estimated weight.

20. The apparatus of claim 15, wherein the delta value corresponds to an amount of time and an amount of energy used in determining the amount by which to adjust the reference voltage.

21. The apparatus of claim 14, wherein a bit of the sensed codeword is in a first distribution when a position of the threshold voltage of the memory cell is less than the amount by which to adjust the reference voltage.

22. The apparatus of claim 21, wherein a bit of the sensed codeword is in a second distribution when a position of the threshold voltage of the memory cell corresponding to that bit is greater than or equal to the amount by which to adjust the reference voltage.

23. A method, comprising:
sensing, by a controller coupled to a memory device, a codeword stored in an array of memory cells of the memory device using a reference voltage;
determining, by the controller, an amount by which to adjust the reference voltage used to sense the codeword based on:
an estimated weight of the original codeword;
a mean of threshold voltage values of each memory cell of the sensed codeword; and
a total quantity of memory cells of the sensed codeword; and
adjusting the reference voltage used to sense the codeword by the determined amount.

24. The method of claim 23, further comprising determining the amount by which to adjust the reference voltage using threshold voltage values included in a distribution of threshold voltage values of memory cells that are in a first data state and excluding threshold voltage values that are included in a distribution of threshold voltage values of memory cells that are in a second data state.

* * * * *